US009269994B2

(12) United States Patent
Patino et al.

(10) Patent No.: US 9,269,994 B2
(45) Date of Patent: Feb. 23, 2016

(54) POWER PACK REMAINING CAPACITY LEVEL DETECTION

(75) Inventors: Joseph Patino, Miramar, FL (US); Marco Pulido, Miramar, FL (US)

(73) Assignee: BlackBerry Limited, Waterloo, Ontario (CA)

( * ) Notice: Subject to any disclaimer, the term of this patent is extended or adjusted under 35 U.S.C. 154(b) by 1091 days.

(21) Appl. No.: 13/340,001

(22) Filed: Dec. 29, 2011

(65) Prior Publication Data
US 2013/0169235 A1 Jul. 4, 2013

(51) Int. Cl.
*H02J 7/00* (2006.01)
*H01M 10/48* (2006.01)
*G01R 31/36* (2006.01)

(52) U.S. Cl.
CPC ........... *H01M 10/488* (2013.01); *G01R 31/361* (2013.01); *G01R 31/3606* (2013.01); *G01R 31/3679* (2013.01); *H01M 10/482* (2013.01); *G01R 31/3675* (2013.01)

(58) Field of Classification Search
CPC .. G01R 31/36; G01R 31/3606; G01R 31/361; G01R 31/3675; G01R 31/3679; H01M 10/482; H01M 10/488
USPC .......... 320/132, 133, 134, 136, 149; 324/426, 324/427; 340/636.1, 636.12, 636.13
See application file for complete search history.

(56) References Cited

U.S. PATENT DOCUMENTS

| 4,595,880 | A | 6/1986 | Patil |
| 5,789,903 | A | 8/1998 | Young et al. |
| 5,949,217 | A | 9/1999 | Okada et al. |
| 5,983,137 | A | 11/1999 | Yerkovich |
| 8,653,793 | B2* | 2/2014 | Ueki et al. ................... 320/132 |
| 8,742,725 | B2* | 6/2014 | Tsujiko et al. ............... 320/132 |
| 2006/0208701 | A1* | 9/2006 | Mikhaylik .................... 320/128 |
| 2011/0193529 | A1* | 8/2011 | Nishimura et al. ........... 320/134 |
| 2012/0133331 | A1* | 5/2012 | Ling et al. ................... 320/132 |
| 2012/0169288 | A1* | 7/2012 | Ueki et al. ................... 320/134 |
| 2013/0234672 | A1* | 9/2013 | Kubota et al. ................ 320/134 |

FOREIGN PATENT DOCUMENTS

| EP | 2093582 | | 8/2009 |
| JP | WO2009122991 | * | 10/2009 |
| JP | WO2011036760 | * | 3/2011 |

OTHER PUBLICATIONS

EESR dated Jul. 9, 2012 for European Patent Application No. 11196111.
Canadian Office Action dated Feb. 4, 2014 for Canadian Application No. 2,799,730.
Canadian Office Action dated Feb. 3, 2015, received for Canadian Patent Application No. 2,799,730.

* cited by examiner

*Primary Examiner* — Richard Isla Rodas
*Assistant Examiner* — Nathaniel Pelton
(74) *Attorney, Agent, or Firm* — Jeffrey N. Giunta; Fleit Gibbons Gutman Bongini & Bianco P.L.

(57) ABSTRACT

Systems and methods to detect particular levels of remaining battery capacities. A ratio of changes in battery output voltage over changes in battery capacity ($\Delta V/\Delta C$) is calculated. Detected rises in the value of this ratio are used to detect that a battery has a remaining capacity level that is near depletion. In a certain temperature range, the $\Delta V/\Delta C$ ratio is used to provide an indication that the battery is approaching a low remaining capacity state. In another temperature range, an increase in the $\Delta V/\Delta C$ ratio indicates that the battery has reached a mid-range remaining capacity level.

17 Claims, 6 Drawing Sheets

POWER PACK REMAINING CAPACITY LEVEL DETECTION

FIELD OF THE DISCLOSURE

The present disclosure generally relates to monitoring a state of remaining capacity of a rechargeable battery, and more particularly to identifying the existence of remaining capacity levels of a battery.

BACKGROUND

Many electronic devices, such as portable electronic devices, include power packs such as batteries to provide operating power to the device. Batteries store an amount of electrical charge and discharge as electrical current is drained from the battery. Some devices include a capacity monitor that maintains an estimate of the remaining capacity in the battery providing power to a device. The capacity monitors often produce an indicator when a discharging battery reaches certain remaining capacity levels. These indicators are used for various purposes, such as providing an indication to a user that the remaining capacity level in the battery is low and will be soon depleted. Once a user receives that warning, a user may stop using the device for unnecessary tasks or power down the device. A controller within the device may also react to low or nearly depleted remaining capacity state indicators by automatically altering circuit configurations or modes, or by powering down some or all electrical circuits as the battery nears a depleted remaining capacity level.

Remaining capacity monitors often operate my monitoring a net amount of electrical current that is provided to or drained from the battery. One dedicated circuit that performs this monitoring is referred to as a "Coulomb counting fuel gauge."Coulomb counter fuel gauges operate by integrating electrical current that is provided to and drained from the battery. Electrical current is provided to the battery by, for example, a charging circuit. Electrical current is drained from the battery by a load, such as an operating circuit. Various factors operate to alter the characteristics of a battery or otherwise cause the Coulomb counting technique of battery capacity monitoring to be inaccurate. Such inaccuracies, particularly at high battery temperatures, sometimes result in a battery reaching a depleted remaining capacity state before the monitoring circuits provide an indication of the depleted state.

Therefore, the operation of battery powered devices will benefit from improved accuracies in detecting low remaining capacity and depleted remaining capacity states of a battery.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present disclosure, in which.

DETAILED DESCRIPTION

Figure 1:
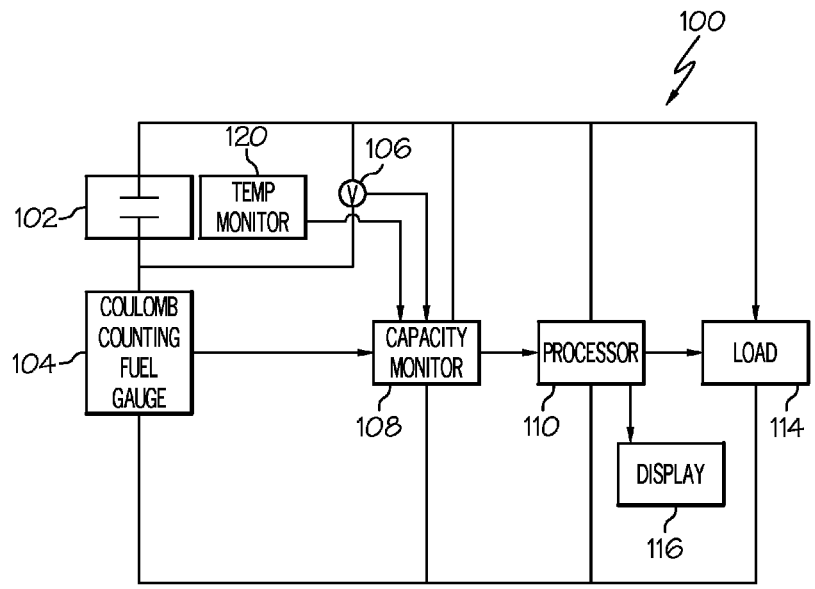
FIG. 1 is a battery powered electronic device component diagram according to one example.

As required, detailed embodiments are disclosed herein; however, it is to be understood that the disclosed embodiments are merely examples and that the systems and methods described below can be embodied in various forms. Therefore, specific structural and functional details disclosed herein are not to be interpreted as limiting, but merely as a basis for the claims and as a representative basis for teaching one skilled in the art to variously employ the disclosed subject matter in virtually any appropriately detailed structure and function. Further, the terms and phrases used herein are not intended to be limiting, but rather, to provide an understandable description.

The terms "a" or "an", as used herein, are defined as one or more than one. The term plurality, as used herein, is defined as two or more than two. The term another, as used herein, is defined as at least a second or more. The terms "including" and "having," as used herein, are defined as comprising (i.e., open language). The term "coupled," as used herein, is defined as "connected," although not necessarily directly, and not necessarily mechanically. The term "configured to" describes hardware, software or a combination of hardware and software that is adapted to, set up, arranged, built, composed, constructed, designed or that has any combination of these characteristics to carry out a given function. The term "adapted to" describes hardware, software or a combination of hardware and software that is capable of, able to accommodate, to make, or that is suitable to carry out a given function. In the following discussion, "handheld" is used to describe items, such as "handheld devices," that are sized, designed and otherwise configured to be carried and operated while being held in a human hand.

In the following discussion, power pack capacity, or remaining capacity, refers to a present level of energy capacity stored in a power pack, such as a rechargeable battery. For example, power pack capacity may refer to a number of Amp-Hours remaining within a power pack or a percentage of the power pack's total designed energy storage capacity when fully charged. Power pack capacity as used below generally refers to a remaining capacity level of a power pack or a comparable measure of any suitable power pack.

The below described systems and processes use techniques that are based upon laboratory measurement derived observations regarding characteristics of Lithium-Ion batteries as they discharge. In particular, laboratory measurements noted that at temperatures of 10° C. and greater, there is a flattening of the voltage vs. remaining capacity curve just before the voltage knee of the curve, where the voltage vs. remaining capacity slopes down. Based on this observed flattening, it was determined that the observed characteristics can be exploited to estimate certain remaining capacity points during battery discharge. One discovered technique includes dividing a change in voltage (ΔV) by a change in capacity (ΔC) over a particular time duration. Using a ratio of a determined change in voltage to a change in remaining capacity, which is able to be expressed in one example as $\Delta V/\Delta C$, it was observed that: 1) over all temperatures and over the entire cycle life of the battery, a large $\Delta V/\Delta C$ spike at low voltages or Capacity can be used to verify that the battery is about to reach end of life, which is generally around 4% remaining capacity; 2) in a temperature range of 10° C. through 60° C. and over the entire cycle life of the battery, a secondary ($\Delta V/\Delta C$) spike occurs that can be used as an early Low Battery Capacity warning, that corresponds to around 13% remaining capacity, that is useful to indicate a low battery indication to a user before powering off; and 3) in a temperature range of 30° C. through 60° C. and over the entire cycle life of the battery, a third ($\Delta V/\Delta C$) spike occurs at approximately 60% capacity.

The below system and methods include an example that utilizes an algorithm that calculates ratios of changes in voltage to changes in capacity ($\Delta V/\Delta C$) of a battery to provide an independent indication, separate from other battery monitoring techniques, of a battery approaching a low remaining capacity (~13% remaining capacity) state to assure that, for example, a user gets a low battery indication. The algorithm further provides an independent indication that the battery capacity is near depletion (~4% remaining capacity), and, for example, that a device powered by the battery about to turn off to assure that the device does not turn off prematurely.

Incorporating the below described systems and method into power pack operated devices, such as battery powered devices, supports more accurate warnings of eminent depletion of battery capacity and a loss of battery energy that will cause the device to cease operation. Such a warning is able to be provided through a user interface to alert a user of the device of eminent device shutoff due to a loss of battery power. Warnings are also able to be electrically produced notifications that are provided to processors within the battery powered device, or to processors located in other devices, to implement processing to accommodate the eminent depletion of battery capacity that is powering the device. Notifications provided to remote processors are able to be communicated through, for example, long distance or short range wireless links.

The system and methods described below overcome problems that have been observed, for example, when relying on "fuel gauge" integrated circuit battery monitoring devices to detect eminent depletion of battery capacities. The operation of fuel gauge integrated circuit battery monitoring devices sometimes fails to provide an indication or notification of an eminent loss of battery capacity, which results in the device loosing power and shutting down without any warning to a user or other processing. Due to the lack of such an indication or notification by conventional fuel gauge integrated circuits, the user or automated processing is not able to take steps to conserve electrical energy when the remaining battery capacity is low. The systems and methods described below are able to be efficiently implemented in portable, handheld, devices and provide a user or processing with more reliable indications of an eminent depletion of remaining battery capacity.

FIG. 1 is a battery powered electronic device component diagram 100 according to one example. The battery powered electronic device component diagram 100 depicts components of an example of a portable battery powered device that incorporates a remaining capacity monitoring circuit. The battery powered electronic device component diagram 100 includes a power pack that in one example is a Lithium-Ion battery 102. The battery 102 in this example has a battery temperature monitor 120 that measures the temperature of the battery 102. As described in further detail below, characteristics of the battery 102 that have been observed in laboratory experiments as being dependent upon the temperature of the battery 102 are used to support alternative low capacity and depleted capacity determination techniques.

The battery 102 in this example is connected in a parallel configuration with a voltmeter 106. Voltmeter 106 measures and reports output voltages of the battery 102. In some examples, voltmeter 106 is also able to determine and produce an open circuit voltage value for the battery 102, which corresponds to the output voltage of the battery 102 when no electrical current is flowing through battery 102.

The battery 102 and voltmeter 106 in some examples are able to be connected in a substantially parallel configuration. Components in a substantially parallel configuration behave substantially as if they were strictly in parallel. The one or both of the couplings between the battery 102 and the voltmeter 106 are able to be either direct couplings or indirect couplings. An indirect connection is able to include, as an example, a connection that include resistive components, reactive components, active components, or combinations of two or more of these types of components.

The battery 102 is further connected in series with a Coulomb counting fuel gauge 104. The Coulomb counting fuel gauge 104 in one example is a well-known component to monitor remaining battery capacity and includes circuitry to continuously measure and integrate or sum the measured amounts of electrical current provided into and drawn from the battery 102. Based upon this continual current measurement and integration or summation, the Coulomb counting fuel gauge 104 maintains an estimate of the remaining capacity of the battery 102. In some examples, the Coulomb counting fuel gauge 104 further includes circuitry to determine the output voltage, including an estimate of the open circuit output voltage, of the battery 102. Battery voltage sensing components in the Coulomb counting fuel gauge 104 are able to replace a separate voltmeter 106 in some examples.

The battery 102 and Coulomb counting fuel gauge 104 in one example may be in a substantially series configuration. Components in a substantially series configuration behave substantially as if they were strictly in series, with all or nearly all of the current that passes through one component passing through the other. In a substantially serial arrangement, the power packs are able to also have other components coupled in series, such as resistive components, reactive components, active components, or combinations of two or more of these types of components.

The battery 102 in one example is a Lithium-Ion battery. Although the Coulomb counting fuel gauge 104 maintains an estimate of the remaining capacity of the battery 102, this estimate may be inaccurate. Operating conditions, such as high battery temperatures, have been observed through testing and experience to cause the estimated remaining capacity level of the battery estimated by the Coulomb counting fuel gauge 104 to be inaccurate. Such inaccuracies are able to cause the Coulomb counting fuel gauge 104 to not report that the battery 102 has a low remaining capacity, or that the remaining capacity level of the battery 102 is near depletion, until after the electrical energy stored in the battery 102 is depleted. Such a failure to properly report low remaining capacity of the battery 102 can result in circuits powered by the battery not being properly preparing for loss of battery power. In some examples, processing to shut down circuits in an orderly manner or processing that causes the circuits to enter a standby or lower power state to conserve the remaining capacity that is stored in the battery 102 is initiated in response to determining a low remaining capacity state of a battery. Further processing performed by components within the battery powered electronic device component diagram 100 is described below that augments and operates with the Coulomb counting fuel gauge 104. This further processing uses alternative techniques to identify low remaining capacity conditions in the battery 102 and that improves detection of low remaining capacity conditions relative to techniques that depend only upon estimating battery capacity by the Coulomb counting fuel gauge 104.

The battery powered electronic device component diagram 100 further includes a capacity monitor 108. The capacity monitor 108 in one example is a dedicated processor or a computing process within a general purpose processor that assembles and processes battery status data to determine when the battery 102 has low or nearly depleted capacity. The capacity monitor 108 receives output voltage values of the battery 102. The output voltages are able to be measured voltages determined by a voltmeter 106 or estimates of open circuit voltages produced by the voltmeter 106 or the Coulomb counting fuel gauge 104. The capacity monitor 108 also receives estimated remaining capacity levels from the Coulomb counting fuel gauge 104. The capacity monitor 108 also receives measured battery temperatures from the battery temperature monitor 120. As described in detail below, battery temperatures are an input to determining remaining battery capacity in some alternative remaining capacity determination techniques.

As described in further detail below, the capacity monitor 108 processes measured battery voltages along with estimated remaining capacity levels to identify low remaining capacity levels of the battery 102 or remaining capacity levels indicating that the battery 102 is nearing depletion of stored energy. The operation of the capacity monitor 108 of one example provides indications of low remaining capacity levels to better support proper device shutdown, particularly in circumstances where the Coulomb counting fuel gauge 104, or other remaining capacity level estimation circuits, do not properly identify low or nearly depleted remaining capacity levels.

Determinations that the battery 102 has a low remaining capacity level or remaining capacity level that is near depletion are able to trigger one or more types of indications. Indications of such low or near depletion capacity levels are able to be provided in the form of one or more of visual indicators, audio indicator, tactile indicators, electrical indicators provided to other circuits within or external to the device being powered by the battery 102. In one example, the capacity monitor 108 provides to a processor 110 an electrical indication that indicates one of a low remaining capacity level for the battery 102 and a remaining capacity level of the battery 102 that is near depletion. Processor 110 in one example configures a load 114 in response to indications of low remaining capacity or of a remaining capacity level that is near stored energy depletion. The load 114 in various examples is able to include processing electronics, wireless communications electronics including RF transmitters and receivers, other circuits that consume electrical current, or any combination of these types of circuits or components. In an example, processor 110 responds to detection of a low remaining capacity level of the battery 102 by configuring the load 114 into a low power mode to conserve the stored energy in the battery. In another example, the processor 110 is able to power down the load 114 in a controlled manner as the remaining capacity of battery 102 is depleted in order to ensure, e.g., retention of data.

The processor 110 is also able to provide a visual indicator of remaining capacity of the battery 102 on a display 116. Display 116 is able to be, for example, a graphical display screen that displays icons that reflect an estimated remaining capacity level of the battery 102. In further examples, the processor 110 is able to provide a display indicting low or near depletion remaining capacity levels by activating an indicator light or providing any output to a user. In yet further examples, the processor 110 is able to indicate to a user that the battery has a low or near depletion remaining capacity level by causing the production of an audio alert, a tactile alert, such as vibration of the device, or any combination of these alerts.

Figure 2:
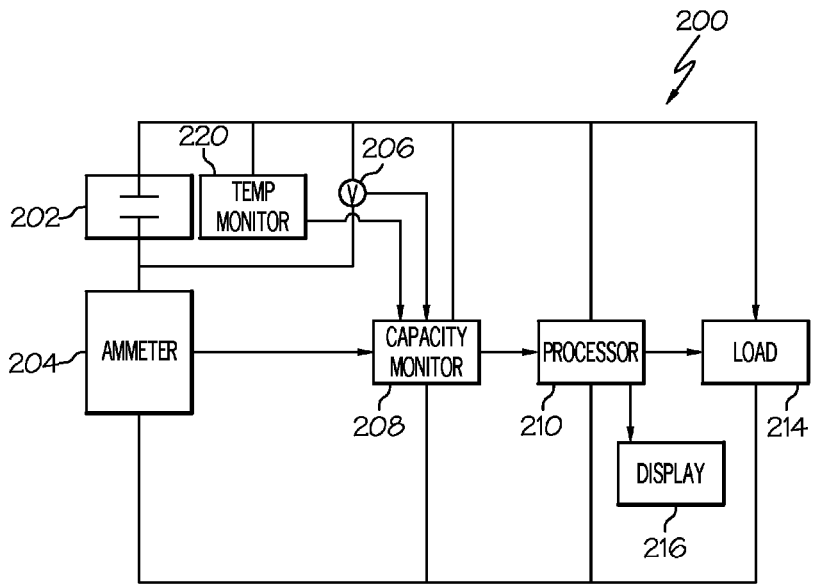
FIG. 2 is an alternative battery powered electronic device component diagram according to one example.

FIG. 2 is an alternative battery powered electronic device component diagram 200 according to one example. The alternative battery powered electronic device component diagram 100 is similar to the battery powered electronic device component diagram 100 with the exception that the Coulomb counting fuel gauge is replaced by an ammeter 204. An alternative capacity monitor 208 of the alternative battery powered electronic device component diagram 200 performs similar functions as the capacity monitor 108 described above and further continually monitors the battery current measured by the ammeter 204 and maintains an integration of measured current to model the estimated remaining capacity of the battery 202. Further alternative capacity monitors are able to maintain estimates of remaining capacity of the battery 202, such as by processing measured output voltages of the battery 202.

The alternative battery powered electronic device component diagram 200 otherwise depicts similar components as the battery powered electronic device component diagram 200. A power pack, which in one example is a Lithium-Ion battery 202, has a battery temperature monitor 220 and is in a parallel configuration with a voltmeter 206. The battery 202 and voltmeter 206 are able, in one example, to be substantially in parallel. The battery 202 is further connected in series with an ammeter 204. The battery 102 and ammeter 204 in one example may be in a substantially series configuration.

The alternative capacity monitor 208 of the alternative battery powered electronic device component diagram 200, in one example, is a dedicated processor or a computing process within a general purpose processor that assembles and processes battery status data to determine when the battery 202 has low or nearly depleted capacity. The alternative capacity monitor 208 receives output voltage values of the battery 202. The output voltages are able to be measured voltages determined by a voltmeter 206 or estimates of open circuit voltages produced by the voltmeter 206 in combination with further data processing. The alternative capacity monitor 208 also receives measured electrical current flowing into and out of the battery 202. The alternative capacity monitor 208 also receives measured battery temperature data from the battery temperature monitor 220. The alternative battery powered electronic device component diagram 200 further includes a processor 210, a load 114, and a display 116 that are similar to the processor 110, load 114, and display 116 described above with regards to the battery powered electronic device component diagram 100.

Figure 3:
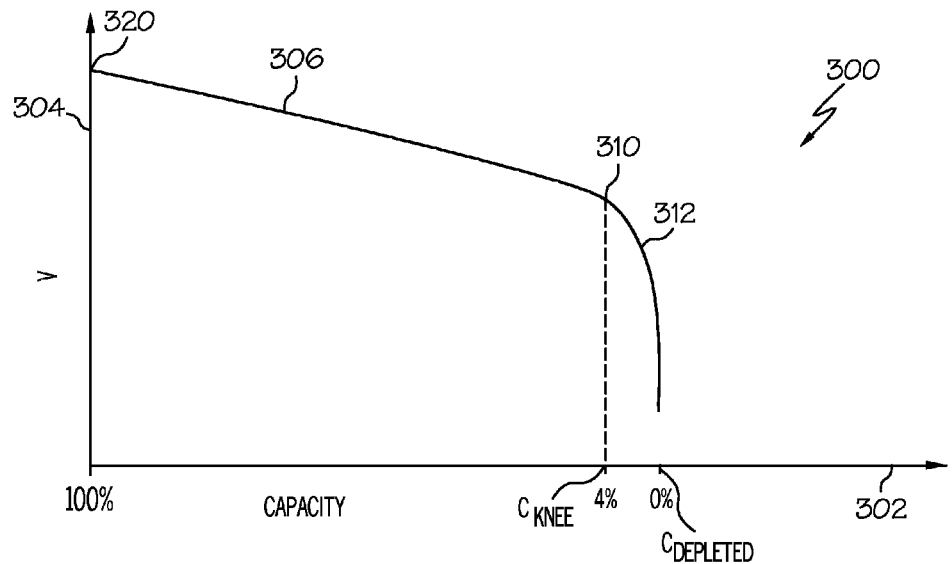
FIG. 3 illustrates a low temperature voltage vs. remaining capacity graph according to one example.

FIG. 3 illustrates a low temperature voltage vs. remaining capacity graph 300, according to one example. The low temperature voltage vs. remaining capacity graph 300 represents observed values of voltage versus estimated remaining capacity levels for a battery that occur with a battery temperature of 0° Celsius. The data presented in the low temperature voltage vs. remaining capacity graph 300 reflects laboratory observations and measurements of output voltage vs. estimated remaining capacity levels for two models of Lithium-Ion batteries that were each supplied by different manufacturers. The use of these observations as a basis for an alternative low or depleted remaining battery capacity technique is supported by the repeatability of these observations on different batteries supplied by different manufacturers The low temperature voltage vs. remaining capacity graph 300 has a remaining capacity axis 302 extending in a horizontal dimension and a voltage axis 304 extending in a vertical direction. The remaining capacity axis 302 represents a full remaining capacity, which is indicated as 100%, at its leftmost end and a depleted remaining capacity, which is indicated as 0%, at its rightmost end. The low temperature voltage vs. remaining capacity graph 300 further has a low temperature voltage vs. remaining capacity relationship line 306 that depicts observed values of battery output voltage at different estimated remaining capacity levels. In one example, the estimated remaining capacity level represented by the remaining capacity axis 302 is estimated by the Coulomb counting fuel gauge 104, as is described above. The voltage represented by the voltage axis 304 is an open circuit output voltage of the battery, similar to the voltage values measured under open circuit conditions or estimated in one example by the voltmeter 106 or Coulomb counting fuel gauge 104, as is described above.

The low temperature voltage vs. remaining capacity relationship line 306 depicts a full remaining capacity point 320 at which the battery has a maximum amount of remaining capacity. The full remaining capacity point 320 also generally corresponds to a state where the battery has a maximum open circuit output voltage. The full remaining capacity point 320 is located at a point where the estimated remaining capacity of the battery as indicated by the horizontal axis is at its maximum. As electrical current is drawn from the battery, the output voltage and estimated remaining capacity level of the battery decrease. The low temperature voltage vs. remaining capacity relationship line 306 indicates the relationship between measured output voltage and estimated remaining capacity level for the battery as electrical current is withdrawn and the remaining capacity level of the battery decreases.

The low temperature voltage vs. remaining capacity relationship line 306 also depicts a voltage vs. capacity point that is referred to herein as a voltage knee. In general, batteries exhibit a slowly decreasing output voltage over most of their remaining capacity levels as current is drawn from the battery. Once the remaining capacity level of a battery reaches the level referred to herein as the voltage knee, however, the output voltage of the battery decreases much more rapidly as a particular amount of current is drawn from the battery than when the remaining capacity level of the battery is above the voltage knee. In one example, the voltage knee occurs when the battery has a remaining capacity level that is approximately 4% of the total capacity that the battery has when fully charged. The low temperature voltage vs. remaining capacity graph 300 depicts a low temperature voltage knee 310.

The low temperature voltage vs. remaining capacity graph 300 an additional point on the low temperature voltage vs. remaining capacity relationship line 306 that is reached after reaching the voltage knee 310 and electrical current is continued to be drawn from the battery. The low temperature voltage vs. remaining capacity relationship line 306 includes a depleted charge voltage level 312 that represents a remaining battery capacity state that corresponds to being essentially depleted when the battery is at this low temperature.

Figure 4:
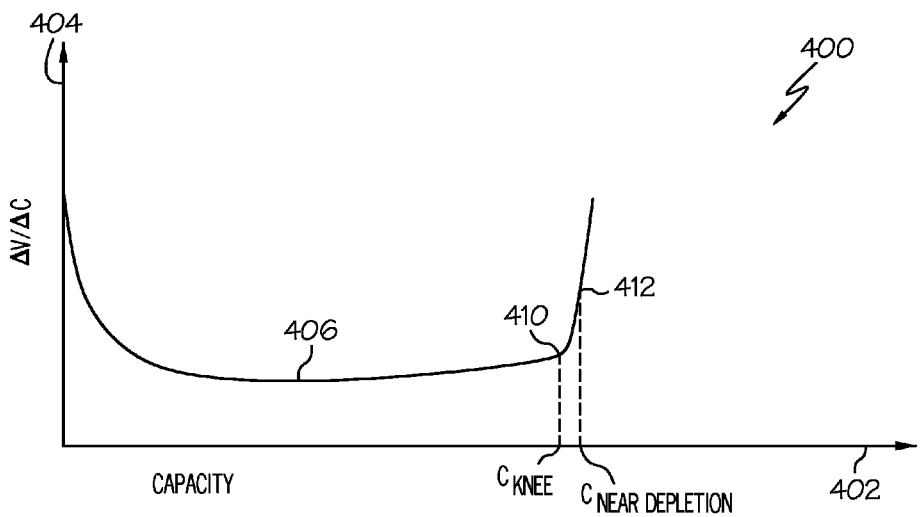
FIG. 4 illustrates a low temperature ΔV/ΔC vs. remaining capacity relationship according to one example.

FIG. 4 illustrates a low temperature $\Delta V/\Delta C$ vs. remaining capacity relationship 400, according to one example. The low temperature $\Delta V/\Delta C$ vs. remaining capacity relationship 400 depicts a low temperature $\Delta V/\Delta C$ ratio value line 406 that indicates ratios of data values depicted in the low temperature voltage vs. remaining capacity graph 300. The vertical axis of the low temperature $\Delta V/\Delta C$ vs. remaining capacity relationship 400 represents $\Delta V/\Delta C$ ratio values. In one example, the nominator of the $\Delta V/\Delta C$ ratio is a change in the measured battery output voltage over a relatively short time duration and is determined by, for example, calculating a difference between a measured voltage at the beginning of the time duration and a measured voltage at the end of the time duration. The denominator of the $\Delta V/\Delta C$ ratio is a change in the estimated remaining capacity level of the battery, as is produced in one example by a Coulomb counting fuel gauge 104, over a relatively short time duration and is determined by, for example, calculating a difference between an estimated remaining capacity level at the beginning of a time duration and an estimated remaining capacity level at the end of that same time duration. The time duration used to determine the nominator value and the denominator value are able to be the same or offset to some degree in time. An offset between the time durations used to determine the nominator and denominator of the $\Delta V/\Delta C$ ratio should be short enough, given expected rates of changes in the nominator and denominator quantities, to allow a correspondence between the measured or estimated values used to determine the nominator and denominator values. As discussed above with regards to FIG. 3, the data presented in the low temperature $\Delta V/\Delta C$ vs. remaining capacity relationship 400 corresponds to observed battery characteristics that exist when the battery is at 0° Celsius.

The low temperature $\Delta V/\Delta C$ vs. remaining capacity relationship 400 has a $\Delta V/\Delta C$ ratio value vertical axis 404 that indicates values of $\Delta V/\Delta C$ ratios for a battery. The low temperature $\Delta V/\Delta C$ vs. remaining capacity relationship 400 also has a remaining capacity horizontal axis 402 that indicates estimated remaining capacities of the battery. Points on the low temperature $\Delta V/\Delta C$ ratio value line 406 reflect observed $\Delta V/\Delta C$ ratio values as a function of remaining capacity for the battery.

The values of the $\Delta V/\Delta C$ ratio such as are depicted in the low temperature $\Delta V/\Delta C$ vs. remaining capacity relationship 400 are monitored and used in some examples to determine when a battery's remaining capacity level is approaching a nearly depleted state when the battery temperature is in a low temperature range. Described below are examples that monitor $\Delta V/\Delta C$ values at higher battery temperatures to also determine when the battery remaining capacity level is at a low remaining capacity level state. In response to detecting that the remaining battery capacity has a nearly depleted status, power reducing actions are able to be performed, a notification is able to be provided to a user, some other action is able to be performed, or any combinations of these actions is able to be performed.

The low temperature $\Delta V/\Delta C$ vs. remaining capacity relationship 400 depicts a low temperature $\Delta V/\Delta C$ knee 410 that corresponds to the voltage knee 310. At the low temperature $\Delta V/\Delta C$ knee 410, the values of the $\Delta V/\Delta C$ ratio begin to increase. Two additional $\Delta V/\Delta C$ values are depicted on the low temperature $\Delta V/\Delta C$ ratio value line 406 that occur after the low temperature $\Delta V/\Delta C$ knee 410 as the battery depletes. A low temperature nearly depleted remaining capacity $\Delta V/\Delta C$ ratio value point 412 depicts a point on an increasing portion of the low temperature $\Delta V/\Delta C$ ratio value line 406. The low temperature nearly depleted remaining capacity $\Delta V/\Delta C$ ratio value point 412 corresponds to the depleted charge level 312 discussed above.

The sequential increase of the $\Delta V/\Delta C$ value during the time duration between the low temperature $\Delta V/\Delta C$ knee 410 and the low temperature nearly depleted remaining capacity ΔV/ΔC ratio value point 412 has been observed in laboratory measurements to indicate that the battery's remaining capacity level is near depletion. In one example, a processor such as the above described capacity monitor 108 determines that the battery temperature is in a low temperature range and further identifies an occurrence of an increase in the value of the ΔV/ΔC ratio. In response to observing an increase in ΔV/ΔC in the low temperature range, the processor produces an indicator that the battery is near capacity depletion. Further reactions to this indicator are taking actions to accommodate the near depletion of the battery, such as shutting down processing circuits or changing their operating mode.

The changes in the values that make up the numerator and the denominator of the ΔV/ΔC ratio values plotted in the low temperature ΔV/ΔC vs. remaining capacity relationship 400 are determined over a time duration that is selected to be long enough allow detection of meaningful changes in values while being sufficiently short to providing sufficient time to respond to the detection of battery remaining capacity level depletion. Below are described further observations made at higher temperatures that detect transient changes in the ΔV/ΔC ratio value to detect low remaining battery capacity conditions. In such examples, the frequency of determining ΔV/ΔC ratio values is selected to ensure capturing the transient changes in ΔV/ΔC ratio values based upon maximum electrical current draw. The time duration used between voltage measurements and capacity estimates to determine the ΔV/ΔC ratio values in one example is shorter than durations between the ΔV/ΔC ratio value determinations themselves. In one example, a time duration between measurements of voltages and estimates of remaining capacity levels used to calculate ΔV/ΔC ratio value are determined over time durations of one minute. It is also clear that these time durations are not required to be uniform over time. In further examples, shorter time durations or longer time durations are able to be used.

The low temperature ΔV/ΔC vs. remaining capacity relationship 400 depicts the ΔV/ΔC as plotted against estimated remaining capacity of the battery. The depiction used in this figure allows the presentation of ΔV/ΔC values that are normalized relative to remaining battery capacity. In general, the change in ΔV/ΔC values over time is dependent upon the amount of electrical current that is drawn from the battery over time. The presentation of the ΔV/ΔC ratio values in dependence to estimated remaining capacity levels of the battery is used in this and subsequent figures to more concisely present the variation in the ΔV/ΔC ratio values without dependence upon the variations over time of the amount of electrical current drawn from the battery. In general operation, a processor monitors ΔV/ΔC ratio values over time and identifies patterns in the changes in the ΔV/ΔC ratio values over time to estimate when a battery remaining capacity level is at various levels, such as a low remaining capacity level or near depletion.

Figure 5:
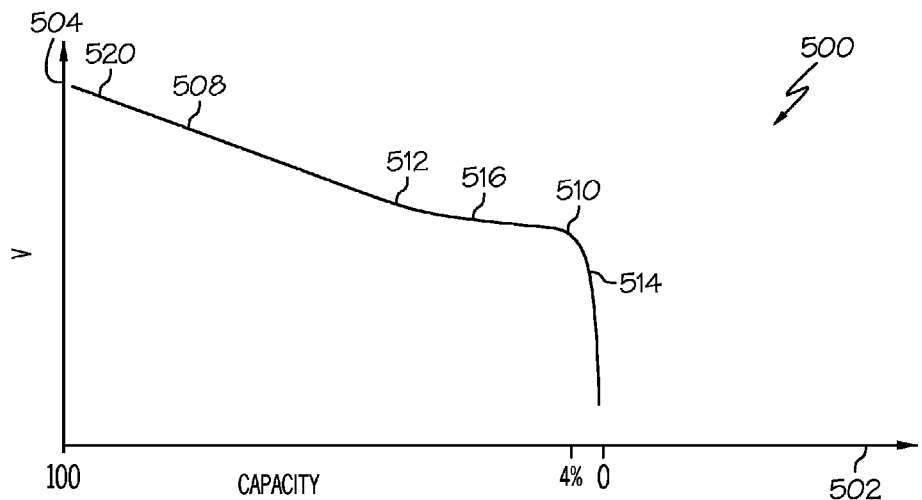
FIG. 5 illustrates a medium temperature voltage vs. remaining capacity graph according to one example.

FIG. 5 illustrates a medium temperature voltage vs. remaining capacity graph 500, according to one example. The medium temperature voltage vs. remaining capacity graph 500 represents observed values of voltage versus estimated remaining capacity levels for a Lithium-Ion battery that is at a temperature of 20° Celsius. The data presented in the medium temperature voltage vs. remaining capacity graph 500 reflects laboratory observations of output voltage vs. estimated remaining capacity levels for the Lithium-Ion batteries discussed above with regards to the low temperature voltage vs. remaining capacity graph 300.

The medium temperature voltage vs. remaining capacity graph 500 has a remaining capacity axis 502 extending in a horizontal dimension and a voltage axis 504 extending in a vertical direction. The remaining capacity axis represents a full remaining capacity, 100%, at its leftmost end and a depleted remaining capacity, 0%, at its rightmost end. The medium temperature voltage vs. remaining capacity graph 500 further has a medium temperature voltage vs. remaining capacity relationship line 506 that depicts observed values of battery output voltage at different estimated remaining capacity levels. As discussed above with reference to the low temperature voltage vs. remaining capacity relationship line 306, the estimated remaining capacity levels represented by the remaining capacity axis 502 are estimated by the Coulomb counting fuel gauge 104 and the voltage represented by the voltage axis 504 is an open circuit output voltage of the battery, similar to that measured in one example by the voltmeter 106.

The medium temperature voltage vs. remaining capacity relationship line 506 depicts a full remaining capacity point 520 at which the battery output has maximum voltage. The full remaining capacity point 520 is located at a point where the estimated capacity as indicated by the horizontal axis is at its maximum. As electrical current is drawn from the battery, the estimated remaining capacity level of the battery decreases. The medium temperature voltage vs. remaining capacity relationship line 506 indicates the relationship between measured output voltage and estimated remaining capacity level for the battery as electrical current is withdrawn and the remaining capacity level of the battery decreases.

As discussed above with regards to the low temperature voltage vs. remaining capacity graph 300, batteries generally exhibit a slowly decreasing output voltage over most of their remaining capacity level as current is drawn from the battery. The medium temperature voltage vs. remaining capacity graph 500 also depicts a medium temperature voltage knee 510, which is similar to the low temperature voltage knee 310 discussed above, after which the output voltage of the battery decreases more rapidly than when the remaining capacity level of the battery is above the medium temperature voltage knee 510.

The medium temperature voltage vs. remaining capacity graph 500 additionally depicts three points on the medium temperature voltage vs. remaining capacity relationship line 506, two that are reached before the medium temperature voltage knee 510 as remaining capacity is drawn from the battery and one that is reached after the medium temperature voltage knee 510. A first medium temperature voltage point 512 and a second medium temperature voltage point 516 are reached before the medium temperature voltage knee 510 and a medium temperature depleted charge voltage point 514 is reached after the medium temperature voltage knee 510.

As electrical current is drawn from the battery at the medium temperature, the medium temperature voltage vs. remaining capacity relationship line 506 has been observed to exhibit a phenomenon that the voltage drop flattens prior to reaching the medium temperature voltage knee 510. In the depicted data, the region of the medium temperature voltage vs. remaining capacity relationship line 506 between the second medium temperature voltage point 516 and the medium temperature voltage knee 510 has less voltage drop for a given change in estimated remaining capacity that is exhibited at low temperatures as depicted in the low temperature voltage vs. remaining capacity graph 300. This flattening has been observed to occur in Lithium-Ion batteries when the battery temperature is between 10° and 60° Celsius. Further, this flattening as been observed to occur when the remaining capacity of the battery is approximately 13%. The methods and systems described below utilize this observed phenomenon to more reliably indentify when a battery has a low remaining capacity level at medium to high temperatures.

In the medium temperature voltage vs. remaining capacity relationship line 506, the battery output voltage level has been observed to drop faster with respect to changes in current between the first medium temperature voltage point 512 and the second medium temperature voltage point 516 than between the second medium temperature voltage point 516 and the medium temperature voltage knee 510. Further, the battery's open circuit output voltage drops rapidly while drawing electrical current from the battery after passing the medium temperature voltage knee 510, including in the region between the medium temperature voltage knee 510 and the second medium temperature depleted charge voltage point 514. The voltage drop after the medium temperature voltage knee 510 is similar to that observed at low temperatures.

Figure 6:
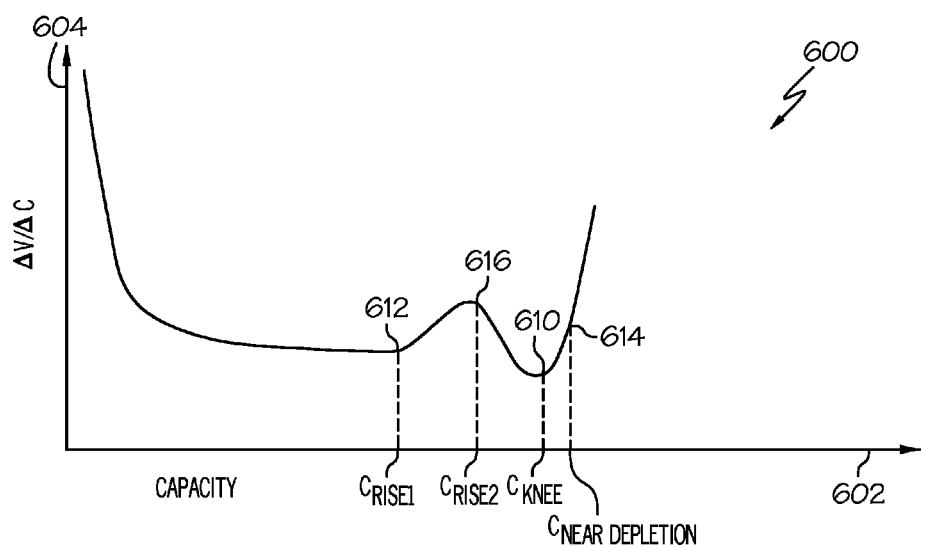
FIG. 6 illustrates a medium temperature ΔV/ΔC vs. remaining capacity relationship according to one example.

FIG. 6 illustrates a medium temperature $\Delta V/\Delta C$ vs. remaining capacity relationship 600, according to one example. The medium temperature $\Delta V/\Delta C$ vs. remaining capacity relationship 600 depicts a $\Delta V/\Delta C$ ratio value line 606 indicating ratios of data derived from the voltage vs. estimated remaining capacity data that is depicted in the medium temperature voltage vs. remaining capacity graph 500. As discussed above with regards to the low temperature $\Delta V/\Delta C$ vs. remaining capacity relationship 400, the nominator of the $\Delta V/\Delta C$ ratio is a change in the measured or estimated battery open circuit output voltage over a relatively short time duration. The denominator of the $\Delta V/\Delta C$ ratio is a change in the estimated remaining capacity level of the battery, as is produced in one example by a Coulomb counting fuel gauge 104, over a relatively short time duration.

The $\Delta V/\Delta C$ values depicted in the medium temperature $\Delta V/\Delta C$ vs. remaining capacity relationship 600 are monitored and used to determine when a battery with a temperature in a medium temperature range has a remaining capacity level that is approaching depletion and to also determine when that battery has a low remaining capacity level. Based upon these remaining capacity level determinations, battery processing is able to be initiated that results in, for example, conservation of battery capacity or protection of circuits by performing, for example, power reducing actions, notification of the user, some other action, or any combinations of these actions. As discussed above with regards to FIG. 5, the data presented in the medium temperature $\Delta V/\Delta C$ vs. remaining capacity relationship 600 corresponds to observed battery characteristics when the battery is at 20° Celsius. The characteristics presented in FIG. 6 have been observed over temperature ranges between 10° and 60° Celsius with Lithium-Ion batteries from different manufacturers.

The medium temperature $\Delta V/\Delta C$ vs. remaining capacity relationship 600 depicts a first medium temperature $\Delta V/\Delta C$ value point 612 that corresponds to the first medium temperature voltage point 512, a second medium temperature $\Delta V/\Delta C$ value point 616 that corresponds to the second medium temperature voltage point 516, and a medium temperature nearly depleted remaining capacity $\Delta V/\Delta C$ value point 614 that corresponds to the medium temperature depleted charge voltage point 514. The medium temperature $\Delta V/\Delta C$ vs. remaining capacity relationship 600 also depicts a medium temperature $\Delta V/\Delta C$ knee 610 that corresponds to the medium temperature voltage knee 510.

The medium temperature $\Delta V/\Delta C$ vs. remaining capacity relationship 600 depicts a pattern of $\Delta V/\Delta C$ values as electrical current is drawn from the battery. The medium temperature $\Delta V/\Delta C$ vs. remaining capacity relationship 600 demonstrates an increase in the $\Delta V/\Delta C$ values between first medium temperature $\Delta V/\Delta C$ value point 612 and second medium temperature $\Delta V/\Delta C$ value point 616 as electrical current is drawn from the battery. As electric current is continued to be drawn from the battery, the $\Delta V/\Delta C$ values decrease after the second medium temperature $\Delta V/\Delta C$ value point 616 until reaching the medium temperature $\Delta V/\Delta C$ knee 610. As electrical current is continued to be drawn from the battery after reaching the medium temperature $\Delta V/\Delta C$ knee 610, the values of the $\Delta V/\Delta C$ ratio begin to again increase. The "rise" between the first medium temperature $\Delta V/\Delta C$ value point 612 and the medium temperature $\Delta V/\Delta C$ knee 610, which includes the second medium temperature $\Delta V/\Delta C$ value point 616, is able to be observed and detected as an indication of the battery having a low remaining capacity status as electrical current is drawn from the battery when the battery temperature is in a medium temperature range. This is in contrast to observing the rise in $\Delta V/\Delta C$ ratio values that occur after the medium temperature $\Delta V/\Delta C$ knee 610, which corresponds to a remaining capacity level that is near depletion. As is seen in FIG. 6, the low remaining capacity status corresponding to a greater level of remaining capacity than the remaining capacity level is near depletion.

The sequential increase of the $\Delta V/\Delta C$ value during the time duration between the first medium temperature $\Delta V/\Delta C$ value point 612 and the second medium temperature $\Delta V/\Delta C$ value point 616 is detected in some examples as an indicator that the remaining battery capacity is at a low level. In some examples, confirmation of the validity of such an observed increase between these two estimated capacity points is able to be made by confirming that a possibly inaccurate estimated remaining capacity of the battery, such as is reported by a Coulomb counting fuel gauge, is at least in a range consistent with such an observation for a low remaining capacity state.

Alternatively, an indication that the battery's reaching a low remaining capacity state is able to be triggered by detecting: 1) the increase between the first medium temperature $\Delta V/\Delta C$ value point 612 and the second medium temperature $\Delta V/\Delta C$ value point 616; 2) the subsequent decrease between the second medium temperature $\Delta V/\Delta C$ value point 616 and the medium temperature $\Delta V/\Delta C$ knee 610; or 3) the combination of that increase and decrease. Another alternative low capacity detection process detects the dip in medium temperature $\Delta V/\Delta C$ values between the second medium temperature $\Delta V/\Delta C$ value point 616 and the medium temperature nearly depleted remaining capacity $\Delta V/\Delta C$ value point 614. In the above discussed laboratory observations, the first medium temperature $\Delta V/\Delta C$ value point 612 has been noted to occur at approximately 13% of remaining battery capacity.

Laboratory measurements show that the magnitude of the drop in $\Delta V/\Delta C$ ratio values between the second medium temperature $\Delta V/\Delta C$ value point 616 and the medium temperature $\Delta V/\Delta C$ knee 610 increases as battery temperatures increase. This drop further causes a steeper increase in $\Delta V/\Delta C$ ratio values as the battery depletes after reaching the medium temperature $\Delta V/\Delta C$ knee 610 value. In some examples, this greater drop in the vicinity of the medium temperature $\Delta V/\Delta C$ knee 610 as battery temperature increases above 10° Celsius is used to more clearly identify remaining capacity levels at higher battery temperatures by, for example, incorporating a $\Delta V/\Delta C$ ratio value change threshold that is dependent upon the temperature of the battery into the $\Delta V/\Delta C$ ratio increase determination.

As discussed above, the changes in the values that make up the numerator and the denominator of the $\Delta V/\Delta C$ ratio values plotted in the medium temperature $\Delta V/\Delta C$ vs. remaining capacity relationship 600 are determined over a time duration. In various examples, the time duration is able to be the same or different than time durations used to determine these values at different battery temperatures. Also similarly to the low temperature $\Delta V/\Delta C$ vs. remaining capacity relationship 400 discussed above, the medium temperature $\Delta V/\Delta C$ vs. remaining capacity relationship 600 depicts the $\Delta V/\Delta C$ as plotted against measured battery voltage. This depiction is also presented to allow the presentation of $\Delta V/\Delta C$ values that are normalized relative to battery remaining capacity depletion. As is also discussed above, a processor monitors the $\Delta V/\Delta C$ ratio values over time and identifies patterns in the changes in the $\Delta V/\Delta C$ ratio values over time to estimate when a battery remaining capacity level is at various levels, such as a low remaining capacity level or near depletion.

Figure 7:
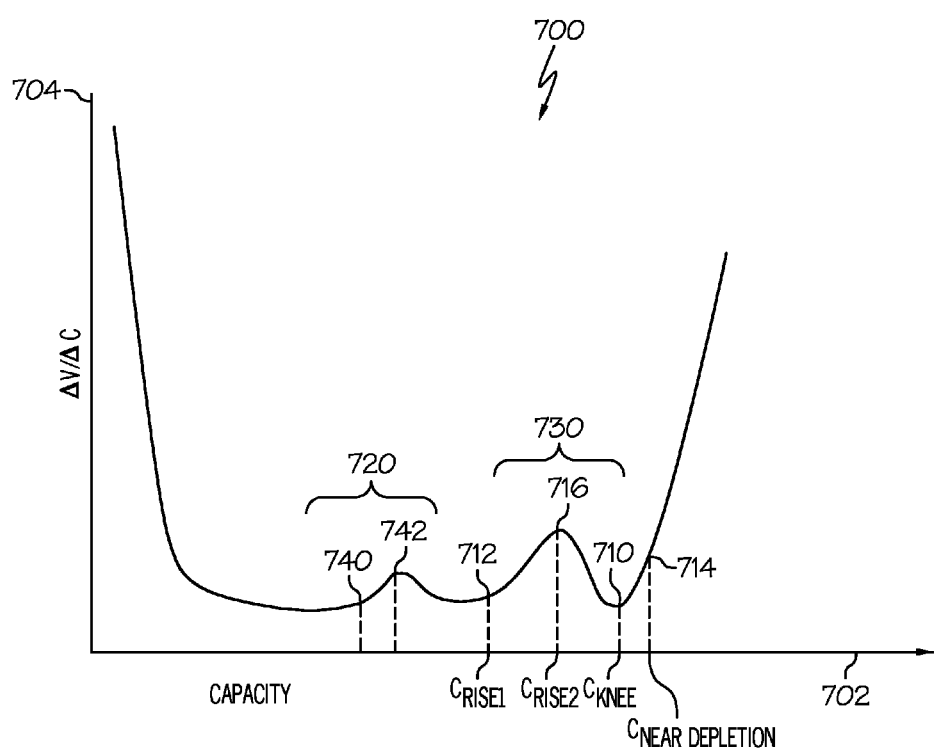
FIG. 7 illustrates a high temperature ΔV/ΔC vs. remaining capacity relationship according to one example.

FIG. 7 illustrates a high temperature $\Delta V/\Delta C$ vs. remaining capacity relationship 700, according to one example. The high temperature $\Delta V/\Delta C$ vs. remaining capacity relationship 700 depicts a $\Delta V/\Delta C$ ratio value line 706 that is similar to the medium temperature $\Delta V/\Delta C$ vs. remaining capacity relationship 600, discussed above. The high temperature $\Delta V/\Delta C$ vs. remaining capacity relationship 700 reflects measurements that were made on the same Lithium-Ion batteries discussed above but when the batteries were in a high temperature range. In this example, the batteries had a temperature of 40° Celsius and similar characteristics were observed for Lithium-Ion batteries in a temperature range between 30° and 60° Celsius.

As discussed above with regards to the medium temperature $\Delta V/\Delta C$ vs. remaining capacity relationship 600, the $\Delta V/\Delta C$ ratio values depicted in the high temperature $\Delta V/\Delta C$ vs. remaining capacity relationship 700 are able to be monitored and used to determine when a battery with a temperature in a high temperature range has a remaining capacity level that is approaching depletion and to also determine when that battery has a low remaining capacity level. Additionally, as described below, $\Delta V/\Delta C$ ratio value characteristics have been observed that allow determining when the remaining capacity of the battery is at a mid-range level of approximately 60% remaining capacity.

The high temperature $\Delta V/\Delta C$ vs. remaining capacity relationship 700 includes a high temperature $\Delta V/\Delta C$ knee 710, a first high temperature $\Delta V/\Delta C$ value point 712, a second high temperature $\Delta V/\Delta C$ value point 716 and a high temperature nearly depleted remaining capacity $\Delta V/\Delta C$ ratio value point 714. These $\Delta V/\Delta C$ value points correspond to the medium temperature $\Delta V/\Delta C$ knee 610, the first medium temperature $\Delta V/\Delta C$ value point 612, the second medium temperature $\Delta V/\Delta C$ value point 616, and the medium temperature nearly depleted remaining capacity $\Delta V/\Delta C$ value point 614, respectively. It is further observed that these value points occur when the battery is in a high temperature range at similar levels of remaining battery capacity as they occur when the battery is at a temperature in a medium temperature range. The battery capacities values that include these three $\Delta V/\Delta C$ value points are collectively referred to herein as a high temperature low capacity rise region 730.

In addition to the high temperature low capacity rise region 730, the high temperature $\Delta V/\Delta C$ vs. remaining capacity relationship 700 further exhibits a mid-capacity rise region 720 of increased $\Delta V/\Delta C$ values in the vicinity of 60% remaining capacity. The mid-capacity region 720 includes a first mid capacity $\Delta V/\Delta C$ ratio value point 740 and a second mid-capacity $\Delta V/\Delta C$ ratio value point 742. The mid-capacity region 720 has been noted to appear when battery temperatures are in a high range. For the Lithium-Ion batteries described above, the mid-capacity region 720 has been noted to appear at battery temperatures between 30° and 60° Celsius.

Figure 8:
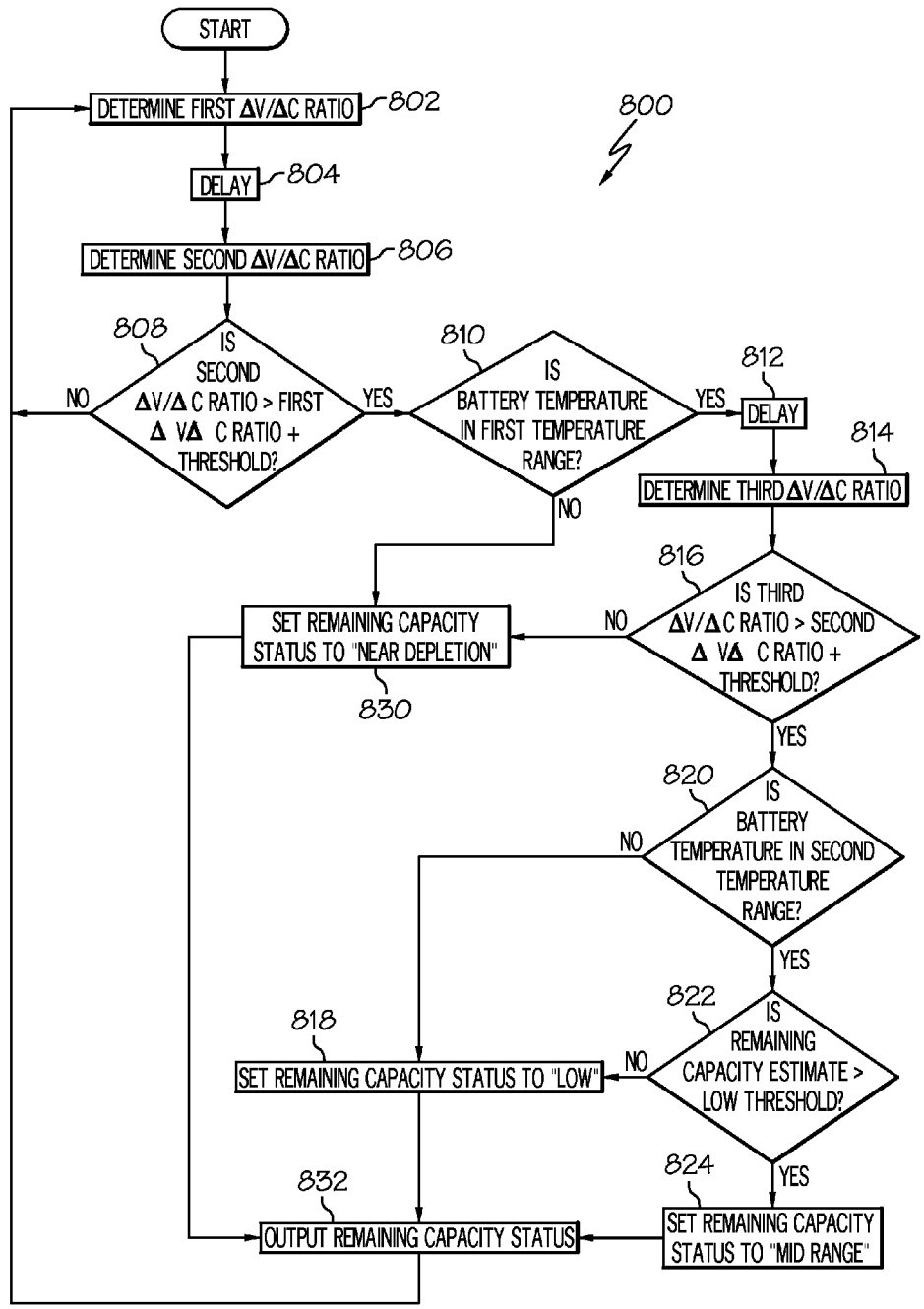
FIG. 8 illustrates a battery remaining capacity determination process in accordance with one example.

FIG. 8 illustrates a battery remaining capacity determination process 800, in accordance with one example. With reference to FIGS. 1 and 2 above, the battery remaining capacity determination process 800 in one example is performed by the capacity monitor 108 or alternative capacity monitor 208 to identify voltage vs. charge relationships that indicate particular remaining battery capacity levels.

The battery remaining capacity determination process 800 begins by determining, at 802, a first $\Delta V/\Delta C$ ratio. Calculation of a $\Delta V/\Delta C$ ratio is described above with regards to FIGS. 4, 6 and 7. The first $\Delta V/\Delta C$ ratio is an example of a first ratio of a change in voltage of the power pack to a change in remaining capacity of the power pack. The $\Delta V/\Delta C$ ratio is measured over a first time duration and the first time duration includes a first time point. As described above, the $\Delta V/\Delta C$ ratio is determined by first measuring, at two instances, the battery output voltage, and estimating, at those two instances, the remaining battery capacity. A time point associated with that $\Delta V/\Delta C$ ratio is a time that occurs between those two instances at which the voltages are measured. A difference between those two measured voltages then forms the $\Delta V$ numerator and a difference between those two estimated remaining capacities forms the $\Delta C$ denominator of the $\Delta V/\Delta C$ ratio. The difference value $\Delta V$ is then divided by the difference value $\Delta C$ to calculate the $\Delta V/\Delta C$ ratio. As discussed above, battery voltages are reported by, for example, a voltmeter 106 and estimated remaining battery capacities are reported by, for example, a Coulomb counting fuel gauge 104 or by processing of data reported by ammeter 204. In further examples, the battery voltages and estimated remaining capacities are able to be determined by any technique.

In one example, determination of the first $\Delta V/\Delta C$ ratio is based upon measurements of battery output voltage and estimations of remaining battery capacity that are made at each of two time instances. The two time instances at which these measurements are made to determine the first $\Delta V/\Delta C$ ratio are separated by a first change time interval. A first time point occurs during the first change time interval and is associated with the first change time interval. The first change time interval is discussed above and an example first change time interval is one minute. The first time point is able to occur anywhere within this first change time interval.

In an alternative example, the $\Delta V/\Delta C$ ratios values are determined by measuring or estimating a derivative of voltage with respect to charge. In such an example, a value of $dV/dC$ or a corresponding partial derivative $\partial V/\partial C$, is able to be determined or estimated by measuring values or specialized hardware that determines such variation dependencies. It is clear that using derivative values of changes in voltage vs. changes in capacity are able to be used in the below described calculations and processing in place of the difference ratios $\Delta V/\Delta C$.

The battery remaining capacity determination process 800 continues by performing a delay, at 804. After the delay, a second $\Delta V/\Delta C$ ratio is determined, at 806. In a manner similar to that discussed above with regards to determining the first $\Delta V/\Delta C$ ratio, determining the second $\Delta V/\Delta C$ ratio is performed by measuring battery output voltages and estimating remaining battery capacities, at two time instances that are separated by a second change time interval. The second $\Delta V/\Delta C$ ratio is an example of a second ratio of a change in voltage of the power pack to a change in remaining capacity of the power pack over a second time duration. The second time duration, over which the second $\Delta V/\Delta C$ ratio is measured or determined, includes a second time point. The second time is subsequent to the first time point because the second $\Delta V/\Delta C$ ratio is determined after the delay performed in 806. The second time point in this example occurs between the two time instances that define the second change time interval. As discussed above, comparable values are also able to be used in place of a determined second $\Delta V/\Delta C$ ratio, such as derivative values for dV/dC or its corresponding partial derivative.

The first change time interval and the second change time interval are able to extend for any length of time that is sufficient to cause an observably large change in the determined and estimated values based upon the amount of current being drawn from the battery being observed. In one example, the $\Delta V/\Delta C$ values are determined based upon voltage and capacity changes that occur over one minute. The first delay 804 in that example uses the same one minute delay. In other examples, longer time durations are able to be used during the first delay 804. In general, the time duration of delay 804 should not be too long, based upon the amount of current expected to be drawn from the battery, to extend beyond the time that the battery will have depleted capacity after the below described increases in the $\Delta V/\Delta C$ ratio value are detected.

Determination of the second $\Delta V/\Delta C$ ratio is similar to the determination of the first $\Delta V/\Delta C$ ratio discussed above. The battery output voltage is similarly measured at two instances in time. The time separation between the two instances at which the values are measured or determined to be used in calculating the $\Delta V/\Delta C$ ratios, i.e., the time duration between voltage measurements used to calculate $\Delta V$ and the time duration between capacity estimates used to calculate $\Delta C$, are able to be equal across ratio determinations or the time separation is able to differ for different determinations. For example, the same time duration value or different time duration values are able to be used between measurements used to determine the first $\Delta V/\Delta C$ ratio and the second $\Delta V/\Delta C$ ratio. Similarly the same time duration values or different time duration values are able to be used for the delay between measurements used to determine the first $\Delta V/\Delta C$ ratio and the second $\Delta V/\Delta C$ ratio.

The battery remaining capacity determination process 800 continues by determining, at 808, if the second $\Delta V/\Delta C$ ratio is greater than a sum of the first $\Delta V/\Delta C$ ratio and a threshold. This determination identifies increases in the $\Delta V/\Delta C$ ratio. If this determination is true, it indicates an increase occurred in the $\Delta V/\Delta C$ ratio during the time duration of performing the second delay 804. As discussed above, increases in the $\Delta V/\Delta C$ ratio over time have been observed to correspond with certain remaining battery capacities levels that can be identified independently of the value of estimates of the specific remaining capacity levels provided by, for example, a Coulomb counting fuel gauge.

A threshold value is able to be included in the determining if the second $\Delta V/\Delta C$ ratio is greater than the sum of the first $\Delta V/\Delta C$ ratio and a threshold. The inclusion of a threshold value is able to provide additional verification that the $\Delta V/\Delta C$ ratio has actually increased and that the observation is not noise in the data or other minor anomaly. A threshold value of zero is also able to be used in an example to simply determine if there is an increase, i.e., to determine that the second ratio is greater than the first ratio. The value of the added threshold is able to be selected, in part, based upon the expected rise in the $\Delta V/\Delta C$ ratio value during the time duration of performing the second time delay and the expected amount of current drained from the battery during the time duration of that delay. In one example, a longer time duration of the second delay is able to be configured to allow a larger threshold value to be used. As discussed above, laboratory measurements indicate that some changes in the $\Delta V/\Delta C$ ratio values become more pronounced as the temperature of the battery increases. Some examples exploit this observation by incorporating threshold values that depend upon the temperature of the battery.

Increases in the value of $\Delta V/\Delta C$ ratios are depicted in the above described figures and examples include the increase between the low temperature $\Delta V/\Delta C$ knee 410 and the low temperature nearly depleted remaining capacity $\Delta V/\Delta C$ ratio value point 412, the increase between the first medium temperature $\Delta V/\Delta C$ value point 612 and the second medium temperature $\Delta V/\Delta C$ value point 616, the increase between the medium temperature $\Delta V/\Delta C$ knee 610 and the medium temperature nearly depleted remaining capacity $\Delta V/\Delta C$ value point 614, as well as increases between the first high temperature $\Delta V/\Delta C$ value point 712 and the second high temperature $\Delta V/\Delta C$ value point 716, the high temperature $\Delta V/\Delta C$ knee 710 and the high temperature nearly depleted remaining capacity $\Delta V/\Delta C$ ratio value point 714, and the first mid-capacity $\Delta V/\Delta C$ ratio value point 740 and the second mid-capacity $\Delta V/\Delta C$ ratio value point 742. Various techniques are able to be used to identify which of these increases is actually occurring when an increase in $\Delta V/\Delta C$ ratio values is observed. Described below is an example of processing that performs this identification. Further examples are able to use any technique to determine or estimate which capacity level is associated with an observed rise in $\Delta V/\Delta C$ ratio values.

If it is not determined, at 808, that the second $\Delta V/\Delta C$ ratio is greater than the sum of the first $\Delta V/\Delta C$ ratio and a threshold, an increase in the $\Delta V/\Delta C$ ratio was not observed and the process returns to determining, at 802, a first $\Delta V/\Delta C$ ratio. If the determination is true, the battery remaining capacity determination process 800 continues by determining, at 810, if the battery temperature is in a first temperature range, or a "first range." In one example, the first temperature range includes the above described medium and high temperature values. In a particular example, the first temperature range corresponds to the battery being in a range between 10° and 60° Celsius. Depending upon the value of battery temperature, the voltage vs. charge relationships for the battery are able to be as described above in either of FIGS. 5 and 6 or in FIG. 7.

If it is not determined that the battery temperature is in the first temperature range, the battery temperature is assumed to be below the first temperature range. In the event that the battery temperature is below the first temperature range, the battery has been observed to exhibit the voltage vs. charge relationships presented above in FIGS. 3 and 4. As depicted in FIG. 4 above, an increase in the $\Delta V/\Delta C$ ratio values when at low temperatures, e.g., below 10° Celsius, indicates that the remaining battery capacity is near depletion. In one example, a remaining battery capacity that is near depletion has less than 4% of total battery capacity remaining and the increase in $\Delta V/\Delta C$ ratio values begins when the battery reaches a remaining capacity level of about 4%.

If it is not determined that the battery temperature is in the first temperature range, at 810, the battery remaining capacity determination process 800 continues by setting, at 830, the remaining battery capacity status to "near depletion." If it is determined that the battery temperature is in the first temperature range, at 810, the battery remaining capacity determination process 800 continues by delaying, at 812. The time duration of this delay is able to be dependent upon an expected time that is required to identify a drop in the $\Delta V/\Delta C$ ratio. The time duration of the delay at 812, as well as the time delay at 804 discussed above, is able to be dependent upon various factors, such as an amount of electrical current that is being drawn from the battery or an expected time for the rise and fall of the ΔV/ΔC ratio to occur. After delaying, the battery remaining capacity determination process 800 determines, at 814, a third ΔV/ΔC ratio.

As discussed above with regards to FIGS. 6 and 7, which depict characteristics at 20° and 40° Celsius, respectively, a temporary "rise" in the ΔV/ΔC ratio values occurs at certain remaining capacity levels when the battery is in the first temperature range. The following depicts an example of processing to determine which "rise" in ΔV/ΔC ratio values is occurring when this temporary increase in ΔV/ΔC ratio values is observed. It is clear that alternative techniques are also able to identify or estimate which remaining battery capacity level corresponds to the detected rise in ΔV/ΔC ratio values.

In both FIGS. 6 and 7, a temporary rise that consists of an increase and a subsequent decrease of ΔV/ΔC ratio values is observed to begin at a remaining battery capacity level of 13%. Detection of this pattern in ΔV/ΔC ratio values as electrical current is drawn from the battery allows an indication to be provided to, for example, alert a user that limited remaining battery capacity exits, to cause processing of a device powered by the battery to change into more power conserving modes, to allow any other reaction to be made in response to a relatively low remaining battery capacity, or to perform any combination of these. The ΔV/ΔC ratio data for a battery that is at a high temperature such as that depicted in FIG. 7, e.g., for a battery with a battery temperature between 30° and 60° Celsius, demonstrates an additional temporary rise in ΔV/ΔC ratio values at approximately 60% remaining battery capacity.

After determining the third ΔV/ΔC ratio value, the battery remaining capacity determination process 800 continues by determining, at 816, if the third ΔV/ΔC ratio value is less than a sum of the second ΔV/ΔC ratio value and a threshold. This determination identifies a temporary increase and decrease in ΔV/ΔC ratio values that occurs during the two delays, at 804, and 812, described above. If this determination is false, the rise in the ΔV/ΔC ratio values observed by the determination at 808 is not temporary and the increase in ΔV/ΔC ratio values corresponds to the battery having a remaining capacity level that is near depletion. Such a rise in ΔV/ΔC ratio values is depicted, for example, in the rise between the medium temperature ΔV/ΔC knee 610 and the second medium temperature ΔV/ΔC value point 614. In response to the determination of 816 being false, the battery remaining capacity determination process 800 sets, at 830, the remaining capacity status to "near depletion."

If it is determined, at 816, that the third ΔV/ΔC ratio value is less than a sum of the second ΔV/ΔC ratio value and a threshold, the battery remaining capacity determination process 800 proceeds by determining, at 820, if the battery temperature is in a second temperature range. In one example, the second temperature range, or "second range," is between 30° to 60° Celsius and includes the high temperature for which ΔV/ΔC ratio data is presented in FIG. 7. If it is not determined that the battery temperature is in the second range, then the voltage vs. capacity characteristics of the battery conform to the data presented in FIGS. 5 and 6. As depicted in FIG. 6, a temporary rise in ΔV/ΔC ratio values detected during the delays at 804 and 812 correspond to the low remaining capacity state between the first medium temperature ΔV/ΔC value point 612 and the medium temperature ΔV/ΔC knee 610. The battery remaining capacity determination process 800 continues by setting, at 818, the remaining battery capacity status to "low."

If the battery temperature is determined, at 820, to be in the second temperature range, the voltage vs. capacity characteristics of the battery conform to the data presented in FIG. 7. In one example, the temporary rise in ΔV/ΔC ratio values is able to be either the mid-capacity rise region 720 or the high temperature low capacity rise region 730. In one example, an identification of which of these two possible remaining battery capacity levels is performed based upon estimated remaining capacity as is maintained by, for example, a Coulomb counting fuel gauge. In further examples, alternative techniques are able to be used to identify which rise in ΔV/ΔC ratio values is being observed.

If the battery temperature is determined to be in the second range, the battery remaining capacity determination process 800 continues by determining, at 822, if the remaining capacity estimate is greater than a low capacity threshold. The remaining capacity estimate is able to be obtained by various techniques such as retrieving a value maintained by a Coulomb counting fuel gauge or measuring battery output voltage. The "low capacity threshold" value is a value selected to identify which level of estimated remaining battery capacity is more likely, the mid-capacity rise region 720 or the high temperature low capacity rise region 730. In one example, the low capacity threshold is able to be set to 30% remaining battery capacity.

In the event that it is determined that the estimated battery capacity is not greater than the low capacity threshold, the battery remaining capacity determination process 800 continues by setting, at 818, the remaining capacity status to "low." In the event that it is determined that the estimated battery capacity is greater than the low capacity threshold, the battery remaining capacity determination process 800 continues by setting, at 824, the remaining capacity status to "mid-range." As described below, an observed increase in ΔV/ΔC ratio values that is above a low capacity threshold level at higher battery temperatures has been observed to correspond to a remaining battery capacity level of approximately 60%.

After setting the remaining battery capacity status to a value, such as to a "near depletion" status at 830, a "low" status at 818, or a "mid-range" status at 824, the battery remaining capacity determination process 800 outputs, at 832, the remaining battery capacity status. In various examples, the output of the remaining battery capacity status is an indication of remaining capacity levels that is communicated through, for example, an electrical indicator, an inter-process data or control mechanism within a processor, any other technique, or combinations of these. The output of the remaining battery capacity status is able to, for example, cause a user interface's display to change to indicate a particular remaining battery capacity level, cause a processor to change an operating mode of a device or circuit to conserve electrical energy, cause or maintain any other action or activity, or any combination of these. Outputting the remaining capacity status, depending upon the value to which the remaining capacity status is set, is an example of indicating that the power pack remaining capacity level is: 1) near depletion, 2) is a low remaining capacity level, or 3) has a mid-range remaining capacity level.

Figure 9:
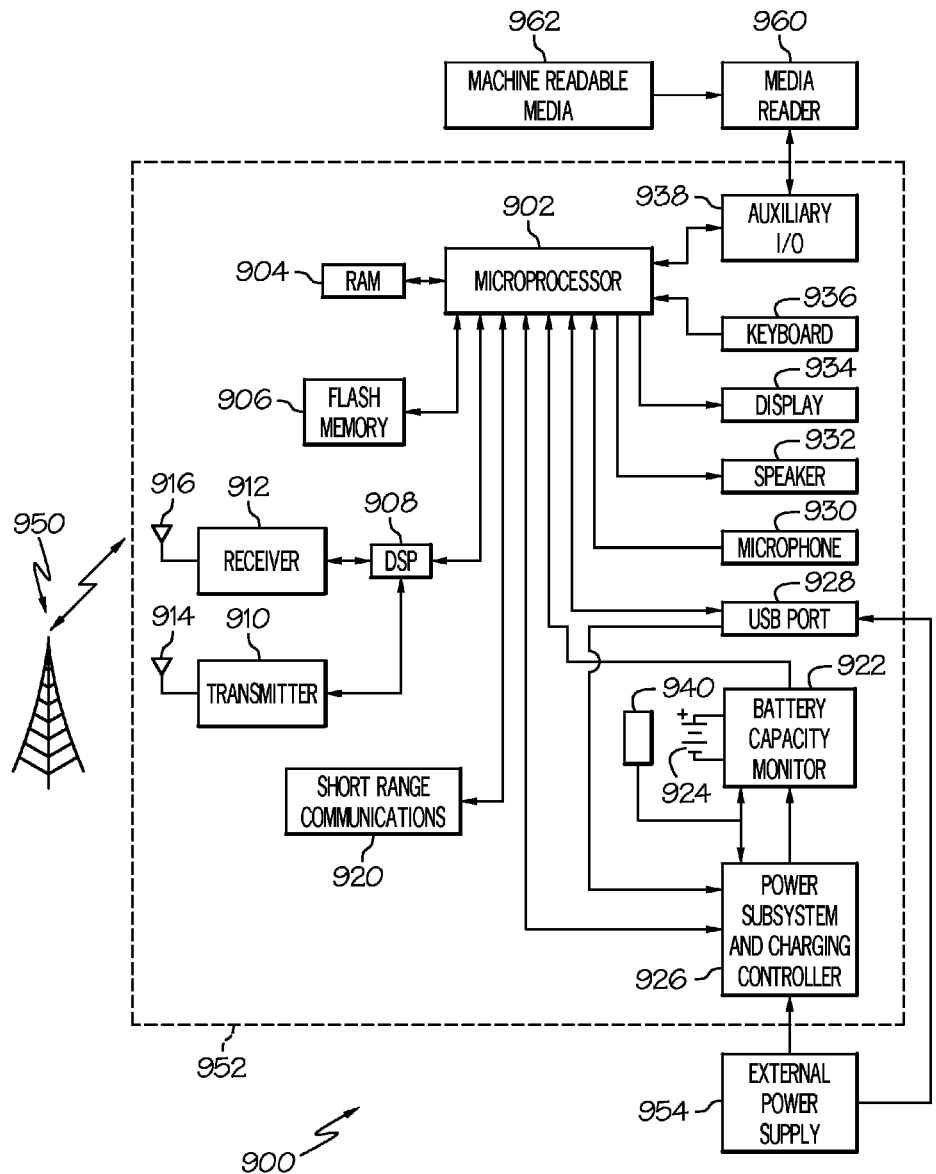
FIG. 9 is a block diagram of an electronic device and associated components in which the systems and methods disclosed herein may be implemented.

FIG. 9 is a block diagram of an electronic device and associated components 900 in which the systems and methods disclosed herein may be implemented. In this example, an electronic device 952 is a wireless two-way communication device with voice and data communication capabilities. Such electronic devices communicate with a wireless voice or data network 950 using a suitable wireless communications protocol. Wireless voice communications are performed using either an analog or digital wireless communication channel. Data communications allow the electronic device 952 to communicate with other computer systems via the Internet.

Examples of electronic devices that are able to incorporate the above described systems and methods include, for example, a data messaging device, a two-way pager, a cellular telephone with data messaging capabilities, a wireless Internet appliance or a data communication device that may or may not include telephony capabilities.

The illustrated electronic device 952 is an example electronic device that includes two-way wireless communications functions. Such electronic devices incorporate communication subsystem elements such as a wireless transmitter 910, a wireless receiver 912, and associated components such as one or more antenna elements 914 and 916. A digital signal processor (DSP) 908 performs processing to extract data from received wireless signals and to generate signals to be transmitted. The particular design of the communication subsystem is dependent upon the communication network and associated wireless communications protocols with which the device is intended to operate.

The electronic device 952 includes a microprocessor 902 that controls the overall operation of the electronic device 952. The microprocessor 902 interacts with the above described communications subsystem elements and also interacts with other device subsystems such as flash memory 906, random access memory (RAM) 904, auxiliary input/output (I/O) device 938, USB Port 928, display 934, keyboard 936, speaker 932, microphone 930, a short-range communications subsystem 920, a power pack capacity monitor 922, a power subsystem and charging controller 926, and any other device subsystems.

A power pack 924 is connected to a power pack capacity monitor 922 and a power subsystem and charging controller 926 as is described in detail above. The power pack 924 provides power to the circuits of the electronic device 952. A power pack temperature monitor 940 monitors the temperature of the power pack 924 and reports the temperature to the power pack capacity monitor 922. The power pack capacity monitor 922 in one example contains a Coulomb counting fuel gauge and performs the battery remaining capacity determination process 800, described above. In further examples, the microprocessor 902 performs the battery remaining capacity determination process 800 based upon data received from the power pack temperature monitor 940, components within a power pack capacity monitor 922, such as voltmeters, ammeters, and the like, or combinations of these components.

The power subsystem and charging controller 926 includes power distribution circuitry for providing power to the electronic device 952 and also contains power pack charging controller circuitry to manage recharging the power pack 924. The power pack temperature monitor 940 monitors the temperature of the power pack 924 and reports the temperature to the power subsystem and charging controller 926. The power subsystem and charging controller 926 in one example halts charging when the power pack temperature exceeds a threshold.

The microprocessor 902 monitors the status and indications produced by the power pack capacity monitor 922 and the power subsystem and charging controller 626 and in some examples performs some or all the processing described above with regards to FIG. 8. The power subsystem and charging controller 926 includes a power pack monitoring circuit that is operable to provide a status of one or more power pack status indicators, such as remaining power pack capacity, temperature, voltage, electrical current consumption, and the like, to various components of the electronic device 952. In one example, the power pack capacity monitor 922 produces indications of the power pack remaining capacity status and delivers those indications to the microprocessor 902. Microprocessor 902 is able to alter its processing, including commanding changes in an operating mode of some components, based upon the received power pack remaining capacity status indicators.

The USB port 928 provides data communication between the electronic device 952 and one or more external devices. Data communication through USB port 928 enables a user to set preferences through the external device or through a software application and extends the capabilities of the device by enabling information or software exchange through direct connections between the electronic device 952 and external data sources rather than through a wireless data communication network.

Operating system software used by the microprocessor 902 is stored in flash memory 906. Further examples are able to use a power pack backed-up RAM or other non-volatile storage data elements to store operating systems, other executable programs, or both. The operating system software, device application software, or parts thereof, are able to be temporarily loaded into volatile data storage such as RAM 904. Data received via wireless communication signals or through wired communications are also able to be stored to RAM 904. As an example, a computer executable program configured to perform the battery remaining capacity determination process 800, described above, is included in a software module stored in flash memory 906.

The microprocessor 902, in addition to its operating system functions, is able to execute software applications on the electronic device 952. A predetermined set of applications that control basic device operations, including at least data and voice communication applications, is able to be installed on the electronic device 952 during manufacture. Examples of applications that are able to be loaded onto the device may be a personal information manager (PIM) application having the ability to organize and manage data items relating to the device user, such as, but not limited to, e-mail, calendar events, voice mails, appointments, and task items.

Further applications may also be loaded onto the electronic device 952 through, for example, the wireless network 950, an auxiliary I/O device 938, USB port 928, short-range communications subsystem 920, or any combination of these interfaces. Such applications are then able to be installed by a user in the RAM 904 or a non-volatile store for execution by the microprocessor 902.

In a data communication mode, a received signal such as a text message or web page download is processed by the communication subsystem, including wireless receiver 912 and wireless transmitter 910, and communicated data is provided the microprocessor 902, which is able to further process the received data for output to the display 934, or alternatively, to an auxiliary I/O device 938 or the USB port 928. A user of the electronic device 952 may also compose data items, such as e-mail messages, using the keyboard 936, which is able to include a complete alphanumeric keyboard or a telephone-type keypad, in conjunction with the display 934 and possibly an auxiliary I/O device 938. Such composed items are then able to be transmitted over a communication network through the communication subsystem.

For voice communications, overall operation of the electronic device 952 is substantially similar, except that received signals are generally provided to a speaker 932 and signals for transmission are generally produced by a microphone 930. Alternative voice or audio I/O subsystems, such as a voice message recording subsystem, may also be implemented on the electronic device 952. Although voice or audio signal output is generally accomplished primarily through the speaker 932, the display 934 may also be used to provide an indication of the identity of a calling party, the duration of a voice call, or other voice call related information, for example.

Depending on conditions or statuses of the electronic device 952, one or more particular functions associated with a subsystem circuit may be disabled, or an entire subsystem circuit may be disabled. For example, if the power pack temperature is high, then voice functions may be disabled, but data communications, such as e-mail, may still be enabled over the communication subsystem.

A short-range communications subsystem 920 is a further optional component which may provide for communication between the electronic device 952 and different systems or devices, which need not necessarily be similar devices. For example, the short-range communications subsystem 920 may include an infrared device and associated circuits and components or a Radio Frequency based communication module such as one supporting Bluetooth® communications, to provide for communication with similarly-enabled systems and devices.

A media reader 960 is able to be connected to an auxiliary I/O device 938 to allow, for example, loading computer readable program code of a computer program product into the electronic device 952 for storage into flash memory 906. One example of a media reader 960 is an optical drive such as a CD/DVD drive, which may be used to store data to and read data from a computer readable medium or storage product such as computer readable storage media 962. Examples of suitable computer readable storage media include optical storage media such as a CD or DVD, magnetic media, or any other suitable data storage device. Media reader 960 is alternatively able to be connected to the electronic device through the USB port 928 or computer readable program code is alternatively able to be provided to the electronic device 952 through the wireless network 950.

Information Processing System

The present subject matter can be realized in hardware, software, or a combination of hardware and software. A system can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present subject matter can also be embedded in a computer program product, which comprises all the features enabling the implementation of the methods described herein, and which—when loaded in a computer system—is able to carry out these methods. Computer program in the present context means any expression, in any language, code or notation, of a set of instructions intended to cause a system having an information processing capability to perform a particular function either directly or after either or both of the following a) conversion to another language, code or, notation; and b) reproduction in a different material form.

Each computer system may include, inter alia, one or more computers and at least a computer readable medium allowing a computer to read data, instructions, messages or message packets, and other computer readable information from the computer readable medium. The computer readable medium may include computer readable storage medium embodying non-volatile memory, such as read-only memory (ROM), flash memory, disk drive memory, CD-ROM, and other permanent storage. Additionally, a computer medium may include volatile storage such as RAM, buffers, cache memory, and network circuits. Furthermore, the computer readable medium may comprise computer readable information in a transitory state medium such as a network link and/or a network interface, including a wired network or a wireless network, that allow a computer to read such computer readable information.

Non-Limiting Examples

Although specific embodiments of the subject matter have been disclosed, those having ordinary skill in the art will understand that changes can be made to the specific embodiments without departing from the spirit and scope of the disclosed subject matter. The scope of the disclosure is not to be restricted, therefore, to the specific embodiments, and it is intended that the appended claims cover any and all such applications, modifications, and embodiments within the scope of the present disclosure.

What is claimed is:

1. A method for determining a remaining capacity state, the method comprising:
    determining, during discharge of a power pack, a first ratio of a change in voltage of the power pack to a change in remaining capacity of the power pack over a first time duration, the first time duration comprising a first time point;
    determining, during discharge of the power pack, a second ratio of a change in voltage of the power pack to a change in remaining capacity of the power pack over a second time duration, the second time duration comprising a second time point, the second time point being subsequent to the first time point;
    determining that the second ratio is greater than the first ratio;
    indicating, based on determining that the second ratio is greater than the first ratio, that a power pack remaining capacity level is near depletion;
    determining a power pack temperature is within a first range at the first time point and at the second time point:
    determining, while the power pack temperature is within the first range, a third ratio of a change in voltage of the power pack to a change in remaining capacity of the power pack over a third time duration, the third time duration comprising a third time point, the third time point being subsequent to the second time point; and
    indicating, in response to determining that the third ratio is less than the second ratio, and further in response to determining that the power pack temperature is within the first range during the first time duration and during the second time duration, that the power pack remaining capacity level is a low remaining capacity level, the low remaining capacity level corresponding to a greater level of remaining capacity than the remaining capacity level is near depletion.

2. The method of claim 1, wherein the determining that the second ratio is greater than the first ratio further determines that the second ratio is greater than a sum of the first ratio and a threshold, the threshold being dependent upon a time duration between the first time point and the second time point.

3. The method of claim 1, wherein the first range includes a range between at least 10 degrees Celsius and 60 degrees Celsius.

4. The method of claim 1, wherein the indicating is in response to determining a sum of the third ratio and a threshold is less than the second ratio.

5. The method of claim 4, wherein the threshold is dependent upon the temperature of the power pack.

6. The method of claim 1, further comprising:
    determining a first power pack temperature is within a second range at the first time point and at the second time point;
    determining an estimated power pack remaining capacity is above a low capacity threshold;
    determining, while the power pack has a temperature within the second range, a third ratio of a change in voltage of the power pack to a change in remaining capacity of the power pack over a third time duration, the third time duration comprising a third time point, the third time point being subsequent to the second time point; and
    indicating, in response to determining that the third ratio is less than the second ratio and that the estimated power pack remaining capacity is above the low capacity threshold, that a power pack has a mid-range remaining capacity level, the mid-range remaining capacity level being greater than a low remaining capacity level.

7. The method of claim 6, wherein the second range includes a range between at least 30 degrees Celsius and 60 degrees Celsius.

8. An apparatus for determining a remaining capacity state, the apparatus comprising:
    a capacity monitor adapted to:
        determine, during discharge of a power pack, a first ratio of a change in voltage of the power pack to a change in remaining capacity of the power pack over a first time duration, the first time duration comprising a first time point;
        determine, during discharge of the power pack, a second ratio of a change in voltage of the power pack to a change in remaining capacity of the power pack over a second time duration, the second time duration comprising a second time point, the second time point being subsequent to the first time point;
        determine that the second ratio is greater than the first ratio;
        indicate, based on determining that the second ratio is greater than the first ratio, that a power pack remaining capacity level is near depletion;
        determine a power pack temperature is within a first range at the first time point and at the second time point;
        determine, while the power pack temperature is within the first range, a third ratio of a change in voltage of the power pack to a change in remaining capacity of the power pack over a third time duration, the third time duration comprising a third time point, the third time point being subsequent to the second time point; and
        indicate, in response to determining that the third ratio is less than the second ratio, and further in response to determining that the power pack temperature is within the first range during the first time duration and during the second time duration, that the power pack remaining capacity level is a low remaining capacity level, the low remaining capacity level corresponding to a greater level of remaining capacity than the remaining capacity level is near depletion.

9. The apparatus of claim 8, wherein the capacity monitor is adapted to determine that the second ratio is greater than the first ratio by determines that the second ratio is greater than a sum of the first ratio and a threshold, the threshold being dependent upon a time duration between the first time point and the second time point.

10. The apparatus of claim 8, wherein the first range includes a range between at least 10 degrees Celsius and 60 degrees Celsius.

11. The apparatus of claim 8, wherein the capacity monitor is adapted to indicate that the power pack remaining capacity level is a low remaining capacity level is in response to determining a sum of the third ratio and a threshold is less than the second ratio.

12. The apparatus of claim 11, wherein the threshold is dependent upon the temperature of the power pack.

13. The apparatus of claim 8, the capacity monitor further adapted to:
    determine a first power pack temperature is within a second range at the first time point and at the second time point;
    determine an estimated power pack remaining capacity is above a low capacity threshold;
    determine, while the power pack has a temperature within the second range, a third ratio of a change in voltage of the power pack to a change in remaining capacity of the power pack over a third time duration, the third time duration comprising a third time point, the third time point being subsequent to the second time point; and
    indicate, in response to determining that the third ratio is less than the second ratio and that the estimated power pack remaining capacity is above the low capacity threshold, that a power pack has a mid-range remaining capacity level, the mid-range remaining capacity level being greater than a low remaining capacity level.

14. The apparatus of claim 13, wherein the second range includes a range between at least 30 degrees Celsius and 60 degrees Celsius.

15. A computer program product for determining a remaining capacity state, the computer program product comprising:
    a computer readable storage medium having computer readable program code embodied therewith, the computer readable program code comprising instructions for:
        determining, during discharge of a power pack, a first ratio of a change in voltage of the power pack to a change in remaining capacity of the power pack over a first time duration, the first time duration comprising a first time point;
        determining, during discharge of the power pack, a second ratio of a change in voltage of the power pack to a change in remaining capacity of the power pack over a second time duration, the second time duration comprising a second time point, the second time point being subsequent to the first time point;
        determining that the second ratio is greater than the first ratio;
        indicating, based on determining that the second ratio is greater than the first ratio, that a power pack remaining capacity level is near depletion;
        determine a power pack temperature is within a first range at the first time point and at the second time point;
        determine, while the power pack temperature is within the first range, a third ratio of a change in voltage of the power pack to a change in remaining capacity of the power pack over a third time duration, the third time duration comprising a third time point, the third time point being subsequent to the second time point; and
        indicate, in response to determining that the third ratio is less than the second ratio, and further in response to determining that the power pack temperature is within the first range during the first time duration and during the second time duration, that the power pack remaining capacity level is a low remaining capacity level, the low remaining capacity level corresponding to a greater level of remaining capacity than the remaining capacity level is near depletion.

16. The computer program product of claim 15, wherein the indicating is in response to determining a sum of the first ratio and a threshold, the threshold being dependent upon a time duration between the first time point and the second time point.

17. The computer program product of claim 15, the computer readable program code further comprising instructions for:
- determining a first power pack temperature is within a second range at the first time point and at the second time point;
- determining an estimated power pack remaining capacity is above a low capacity threshold;
- determining, while the power pack has a temperature within the second range, a third ratio of a change in voltage of the power pack to a change in remaining capacity of the power pack over a third time duration, the third time duration comprising a third time point, the third time point being subsequent to the second time point; and
- indicating, in response to determining that the third ratio is less than the second ratio and that the estimated power pack remaining capacity is above the low capacity threshold, that a power pack has a mid-range remaining capacity level, the mid-range remaining capacity level being greater than a low remaining capacity level.

* * * * *